(12) United States Patent
Park et al.

(10) Patent No.: US 9,814,167 B2
(45) Date of Patent: Nov. 7, 2017

(54) COIL COMPONENT

(71) Applicant: SAMSUNG ELECTRO-MECHANICS CO., LTD., Suwon-Si, Gyeonggi-Do (KR)

(72) Inventors: Seung Wook Park, Suwon-Si (KR); Kwang Mo Kim, Suwon-Si (KR); Won Chul Sim, Suwon-Si (KR)

(73) Assignee: SAMSUNG ELECTRO-MECHANICS CO., LTD., Suwon-si, Gyeongg-do (KR)

( * ) Notice: Subject to any disclaimer, the term of this patent is extended or adjusted under 35 U.S.C. 154(b) by 0 days.

(21) Appl. No.: 14/937,063

(22) Filed: Nov. 10, 2015

(65) Prior Publication Data

US 2016/0163446 A1 Jun. 9, 2016

(30) Foreign Application Priority Data

Dec. 3, 2014 (KR) .................. 10-2014-0172317

(51) Int. Cl.
| H01F 5/00 | (2006.01) |
| H01F 27/24 | (2006.01) |
| H05K 9/00 | (2006.01) |
| H01F 17/00 | (2006.01) |

(52) U.S. Cl.
CPC ....... H05K 9/0067 (2013.01); H01F 17/0013 (2013.01); H01F 17/0033 (2013.01)

(58) Field of Classification Search
CPC ......... H01F 27/2804; H01F 2027/2809; H01F 17/0006; H01F 17/0013; H05K 9/0067
USPC ........................................ 336/200, 223, 233
See application file for complete search history.

(56) References Cited

U.S. PATENT DOCUMENTS

| 7,318,269 B2 * | 1/2008 | Yoshida | G11B 5/1274 |
| | | | 29/602.1 |
| 2003/0134612 A1 * | 7/2003 | Nakayama | H01F 17/0013 |
| | | | 455/307 |
| 2005/0068148 A1 * | 3/2005 | Yoshida | H01F 17/0013 |
| | | | 336/200 |
| 2005/0128042 A1 | 6/2005 | Tomohiro et al. | |
| 2005/0195062 A1 * | 9/2005 | Yoshida | H01F 27/2804 |
| | | | 336/200 |

(Continued)

FOREIGN PATENT DOCUMENTS

| JP | 2006-303209 A | 11/2006 |
| JP | 2010-177380 A | 8/2010 |

(Continued)

OTHER PUBLICATIONS

Korean Office Action issued in Korean Application No. 10-2014-0172317 dated Oct. 7, 2015, with English Translation.

Primary Examiner — Mangtin Lian
(74) Attorney, Agent, or Firm — McDermott Will & Emery LLP

(57) ABSTRACT

A coil component capable of matching characteristic impedance (Zo) includes an insulating layer in which coil conductors are embedded; a first magnetic member disposed to be in contact with one surface of the insulating layer; and a second magnetic member having permeability lower than that of the first magnetic member and disposed to be in contact with the other surface of the insulating layer. An interval L1 between the second magnetic member and the coil conductors depends on an intended impedance value.

11 Claims, 3 Drawing Sheets

(56) References Cited

U.S. PATENT DOCUMENTS

| | | | |
|---|---|---|---|
| 2010/0157565 A1* | 6/2010 | Yoshida | H01F 27/292 361/811 |
| 2013/0076456 A1* | 3/2013 | Chang | H03H 7/427 333/185 |
| 2013/0154767 A1 | 6/2013 | Kim et al. | |
| 2014/0132366 A1 | 5/2014 | Kim et al. | |
| 2014/0176283 A1 | 6/2014 | Yang et al. | |
| 2016/0099102 A1* | 4/2016 | Matsunaga | H01F 17/0013 336/105 |

FOREIGN PATENT DOCUMENTS

| | | |
|---|---|---|
| KR | 10-2005-0059412 A | 6/2005 |
| KR | 10-2006-0052814 A | 5/2006 |
| KR | 10-2013-0070212 A | 6/2013 |
| KR | 10-2014-0061037 A | 5/2014 |
| KR | 10-2014-0083577 A | 7/2014 |

* cited by examiner

COIL COMPONENT

CROSS-REFERENCE TO RELATED APPLICATION

This application claims benefit of priority to Korean Patent Application No. 10-2014-0172317 filed on Dec. 3, 2014, with the Korean Intellectual Property Office, the disclosure of which is incorporated herein by reference.

BACKGROUND

The present disclosure relates to a coil component having adjustable impedance.

In recent years, electronic devices such as portable phones, home appliances, personal computers (PCs), personal digital assistants (PDAs), liquid crystal displays (LCDs), navigation systems, and the like have gradually been digitalized and provided with faster processing speeds. Since these electronic devices are sensitive to external stimuli, low abnormal voltage and high frequency noise may be present in the internal circuits of the electronic devices, and may cause damage to circuits and signal distortion.

Switching voltages generated in circuits, power noise included in power supply voltages, unnecessary electromagnetic signals or noises, and the like may cause such abnormal voltages and noise. As a means for preventing the abnormal voltages and the high frequency noise from flowing into circuits, coil components have widely been used.

In particular, high speed interfaces such as universal serial buses (USBs) 2.0, USBs 3.0, and high-definition multimedia interface (HDMI) have adopted a differential signal system that transmits differential signals (differential mode signals) using a pair of signal lines, unlike a general single-end transmission system. Thus, the differential signal transmission system uses a common mode filter (CMF) for removing common mode noise.

When a capacitive element such as a CMF is provided on a transmission line, a high frequency signal or a high speed pulse signal transmitted through the transmission line may be reflected or attenuated. In the case in which the capacitive element is provided on the transmission line, characteristic impedance (Zo) at an insertion position of the capacitive element may be deteriorated by a capacitance component of the capacitive element, and as a result, impedance matching may not occur in a corresponding position.

When the transmission line has a portion in which the impedance matching does not occur, since a non-matching portion of characteristic impedance (Zo) may be reflected, return loss may occur. As a result, the signal may be significantly attenuated, and unnecessary radiation may occur within the transmission line by the reflection, which is a cause of noise generation.

Thus, characteristic impedance (Zo) of capacitive coil components used as a variety of electrostatic discharge (ESD) preventing components including a CMF is required to match impedance of the signal transmitting system into which the coil components are inserted.

Characteristic impedance (Zo) in the coil component may be adjusted by altering line width of a spiral coil conductor constituting the coil component, interlayer distance between the coil conductors, dielectric constant of a material present between the coil conductors, or the like. For example, when a distance between patterns is reduced or the interlayer distance between the coil conductors is decreased by forming the line width of the coil conductor to be significantly wide, or the dielectric constant of the material present between the coil conductors is increased, a parasitic capacitance component may be increased, whereby characteristic impedance (Zo) may be decreased.

However, the adjustment of characteristic impedance Zo by the dielectric constant naturally has a limitation due to the characteristics of the material, and it is also difficult to adjust characteristic impedance Zo by the interlayer distance between the coil conductors or the line width of the coil conductor due to a recent trend for thinness and lightness, and a fine pattern of the coil component.

SUMMARY

An aspect of the present disclosure provides a coil component having a required impedance value by adjusting thickness of an insulating layer.

According to an aspect of the present disclosure, a coil component may include: an insulating layer in which coil conductors are embedded; a first magnetic member in contact with one surface of the insulating layer; and a second magnetic member in contact with the other surface of the insulating layer, having permeability lower than that of the first magnetic member. An interval L1 between the second magnetic member and the coil conductors varies depending on an impedance value.

The insulating layer may include a first insulating layer which is in contact with the first magnetic member and a second insulating layer disposed on the first insulating layer to cover the coil conductors, and a thickness of the second insulating layer may vary depending on the impedance value.

According to another aspect of the present disclosure, a coil component may include a first magnetic member; an insulating layer disposed on the first magnetic member and having coil conductors embedded therein; a second magnetic member disposed on the insulating layer and having permeability lower than that of the first magnetic member; and an impedance adjusting member disposed between the insulating layer and the second magnetic member and having a thickness that depends on an intended impedance value.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
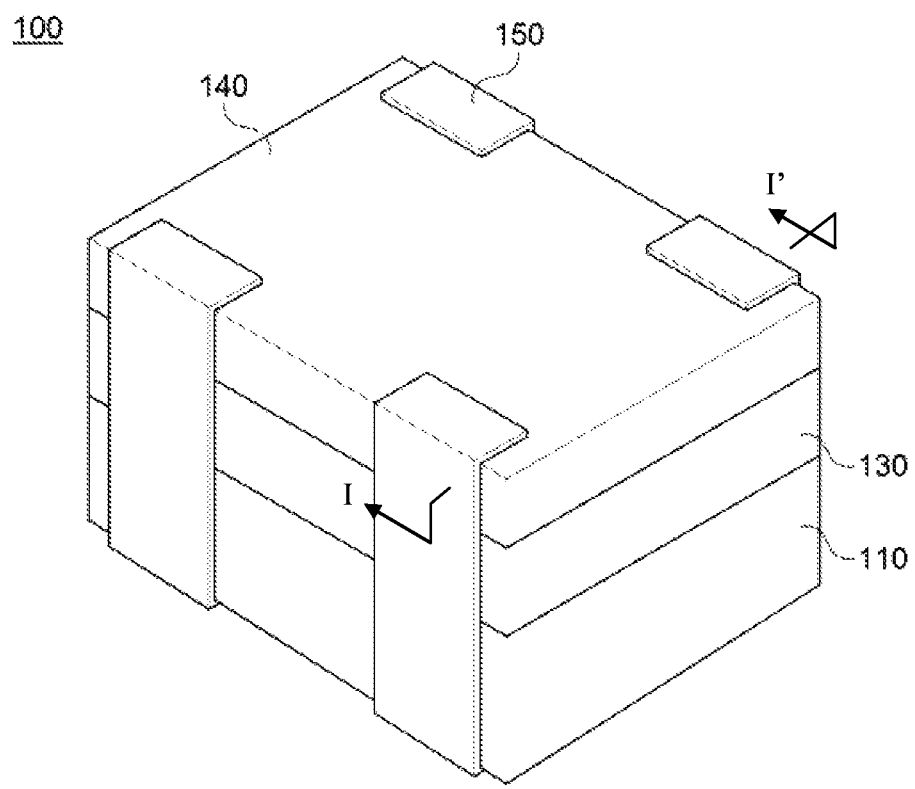
FIG. 1 is a perspective view of a coil component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
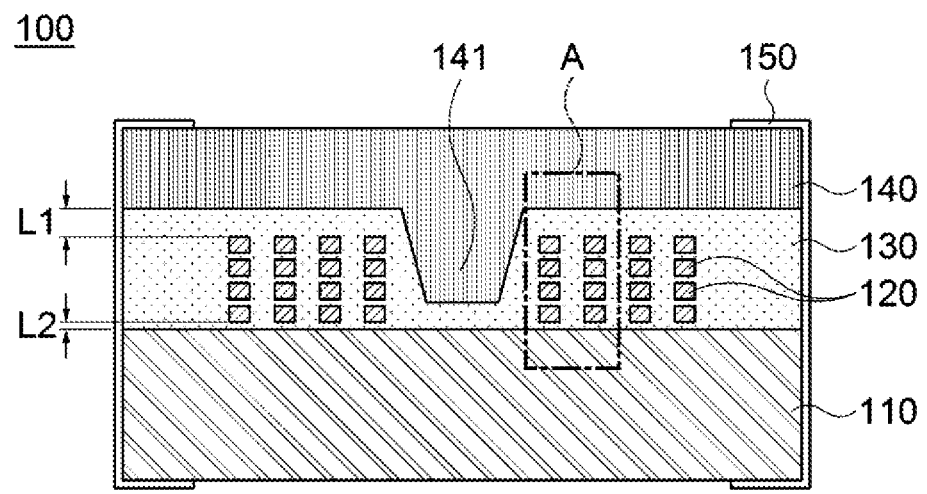
FIG. 2 is a cross-sectional view taken along line I-I' of FIG. 1.

FIG. 1 is a perspective view of a coil component according to an exemplary embodiment in the present disclosure and FIG. 2 is a cross-sectional view taken along line I-I' of FIG. 1.

Referring to FIGS. 1 and 2, a coil component 100, according to an exemplary embodiment, may include a first magnetic member 110, a second magnetic member 140, and an insulating layer 130 in which coil conductors 120 are embedded.

Further, the coil component 100 may further include external terminals 150 formed on end surfaces of a multi-layer body including the insulating layer 130, the first magnetic member 110, and the second magnetic member 140. Although not illustrated in the drawings, end portions of the coil conductors 120 may lead to outer peripheral surfaces on which the external terminals 150 are formed, thereby being connected to the external terminals 150 and implementing external electrical conduction.

The insulating layer 130, a polymer resin layer surrounding the coil conductors 120, may have an upper surface and a lower surface opposing each other. Hereinafter, "one surface" of the insulating layer 130 indicates any one of the upper and lower surfaces of the insulating layer 130, and "the other surface" of the insulating layer 130 indicates the opposite surface of the upper and lower surfaces.

The insulating layer 130 may serve to insulate between patterns of the coil conductors 120 and protect the coil conductors 120 from external factors while applying flatness to a base surface of the coil conductors 120.

Thus, the insulating layer 130 may be formed of a polymer resin having superior thermal resistance, moisture resistance, and superior insulating properties. Examples of an optimal material forming the insulating layer 130 may include an epoxy resin, a phenol resin, a urethane resin, a silicon resin, a polyimide resin, and the like.

The first magnetic member 110, a magnetic substrate having an approximately rectangular parallelepiped shape provided to be in contact with one surface of the insulating layer 130, may be formed of a sintered ferrite and have a predetermined hardness. Thus, the first magnetic member 110 may be disposed in the lowest portion of the coil component 100, and the insulating layer 130 and the second magnetic member 140 are sequentially stacked on the first magnetic member 110, and thus the first magnetic member 110 may support the insulating layer 130 and the second magnetic member 140.

The first magnetic member 110 may serve as a movement path of magnetic flux generated from the coil conductors 110 when current is applied, in addition to having a role as the above-mentioned supporting body. Thus, the first magnetic member 110 may be formed of any magnetic material as long as it may obtain predetermined inductance. For example, for a material forming the first magnetic member 110, a nickel (Ni) based ferrite material containing $Fe_2O_3$ and NiO as main components, a Ni—Zn based ferrite material containing $Fe_2O_3$, NiO, and ZnO as main components, a Ni—Zn—Cu based ferrite material containing $Fe_2O_3$, NiO, ZnO, and CuO as main components, or the like may be used.

The second magnetic member 140 may be formed to be in contact with the other surface of the insulating layer 130. Thus, the second magnetic member 140 may face the first magnetic member 110 while having the insulating layer 130 therebetween, thereby forming the movement path of the magnetic flux together with the first magnetic member 110. That is, the magnetic flux generated from the coil conductors 120 may pass through the second magnetic member 140 from the top of the coil conductors 120 and may pass through the first magnetic member 110 from the bottom of the coil conductors 120, thereby forming a closed magnetic path.

The second magnetic member 140 may be formed of a composition in which magnetic powders are dispersed in the polymer resin, and may be formed by coating a liquefied magnetic resin paste on the insulating layer 130 and then drying the liquefied magnetic resin paste. The coil component 100, according to the exemplary embodiment, may further include, as a structure for increasing permeability, a magnetic core 141 that penetrates through a center portion of the insulating layer 130 so as to be inserted into a deep part surrounded by the coil conductors 120. In this case, the second magnetic member 140 and the magnetic core 141 may be simultaneously formed by coating the liquefied magnetic resin paste on an upper surface of the insulating layer 130 as well as an interior of a cavity formed in the insulating layer 130.

In addition, a polymer resin having high elasticity contained in the second magnetic member 140 absorbs external shock generated during manufacturing processes such as sintering, polishing, and the like, whereby a defect occurrence rate of a product may be suppressed.

For the magnetic powders mixed in the second magnetic member 140, the nickel (Ni) based ferrite, the Ni—Zn based ferrite, the Ni—Zn—Cu based ferrite, or the like having high permeability may be used. In this case, as a content ratio of the magnetic powders is larger than that of the polymer resin, permeability is increased; however, specific gravity of the resin is decreased, whereby adhesion between the second magnetic member 140 and the insulating layer 130 may be deteriorated. Thus, product defects such as delamination, cracking, or the like occur in a case in which the magnetic powders of a predetermined value or more are mixed in the second magnetic member 140. The second magnetic member 140, which is a magnetic resin composite, may have permeability lower than that of the first magnetic member 110 formed of the sintered ferrite.

The coil conductors 120, metal wires having coil patterns plated in a spiral shape, may be formed of at least one metal selected from the group consisting of silver (Ag), palladium (Pd), aluminum (Al), nickel (Ni), titanium (Ti), gold (Au), copper (Cu), and platinum (Pt) having superior electrical conductivity.

The coil conductors 120 may be provided in two or more layers, wherein the coil conductors 120 in each layer are disposed to face each other in a state in which the coil conductors 120 are spaced apart from each other by a predetermined interval. As such, in the case in which the coil conductors 120 are provided in the plurality of layers, the coil conductors 120 on respective layers may be connected through vias (not illustrated) to form a single coil.

Alternatively, the coil conductors 120 on respective layers may form separate coils. For example, the coil conductors 120 in a lower portion of the insulating layer 130 which is close to the first magnetic member 110 may become a first coil conductor and the coil conductors 120 in an upper portion of the insulating layer 130 which is close to the second magnetic member 140 may become a second coil conductor, and thus the first coil conductor and the second coil conductor may form a strong magnetic coupling.

In this case, the coil component 100, according to the exemplary embodiment, may be operated as a common mode filter (CMF) in which when currents having the same direction are applied to the first coil conductor and the second coil conductor, the magnetic fluxes are added to each other to increase common mode impedance, and when currents having opposing directions flow in the first coil conductor and the second coil conductor, the magnetic fluxes are offset to decrease differential mode impedance.

Each of the first and second coil conductors forming the separate coils may be provided in a single layer, but may generally have a multilayer structure in order to implement high inductance. In this case, the first coil conductors in respective layers may be connected to each other through a first via (not illustrated) to form a coil, and the second coil conductors in respective layers may also be connected to each other through a second via (not illustrated) formed in a position different from the first via to form another coil. For example, the first coil conductors may be disposed in odd layers such as first and third layers and connected to each other through the first via penetrating through even layers, and the second coil conductors may be disposed in the even layers such as second and fourth layers and connected to each other through the second via penetrating through the odd layers. Alternatively, the first coil conductors may be disposed in the first and second layers and the second coil conductors may also be sequentially disposed in the third and fourth layers.

As such, the coil component 100, according to the exemplary embodiment, may include the coil conductors 120 in the plurality of layers, which are electrically conducted by various connection structures such as vias. Here, the coil conductors 120 in a layer which is closest to the second magnetic member 140 among the coil conductors 120 in the plurality of layers, that is, the coil conductors 120 disposed on the uppermost layer in FIG. 2, are disposed to be spaced apart from the second magnetic member 140 by a predetermined interval L1.

Specifically, the interval L1 may be a distance between the upper surface of the coil conductors 120 disposed in the uppermost layer and the lower surface of the second magnetic member 140, and may vary depending on an impedance value necessary to match characteristic impedance (Zo). That is, since impedance is decreased as the second magnetic member 140 is apart from the coil conductors 120, characteristic impedance (Zo) may be matched by increasing the interval L1 in a case in which a low impedance value is required and decreasing the interval L1 in a case in which a high impedance value is required.

As such, in a case in which the interval between the magnetic member having low permeability, that is, the second magnetic member 140 and the coil conductors 120 varies, since impedance sensitively varies, the impedance value may be controlled by simply adjusting the interval of several μm. As a result, the impedance matching may be implemented even when a total thickness of the coil component is not largely changed.

In general, a magnetic substrate formed of the sintered ferrite, that is, the first magnetic member 110, may have permeability of 150 or more, while the second magnetic member 140, which is the magnetic resin composite, may have permeability of 10 to 20. Therefore, in a case in which an interval L2 between the coil conductors 120 which are closest to the first magnetic member 110, that is, the coil conductors 120 disposed in the lowest layer in FIG. 2 and the first magnetic member 110 varies, variations in impedance may become insensitive due to a magnetic body having high permeability (i.e., the first magnetic member 110). Thus, in a case in which the interval L2 is adjusted for impedance matching, the total thickness of the coil component may be greatly changed, which interrupts standardization of the product.

Figure 3:
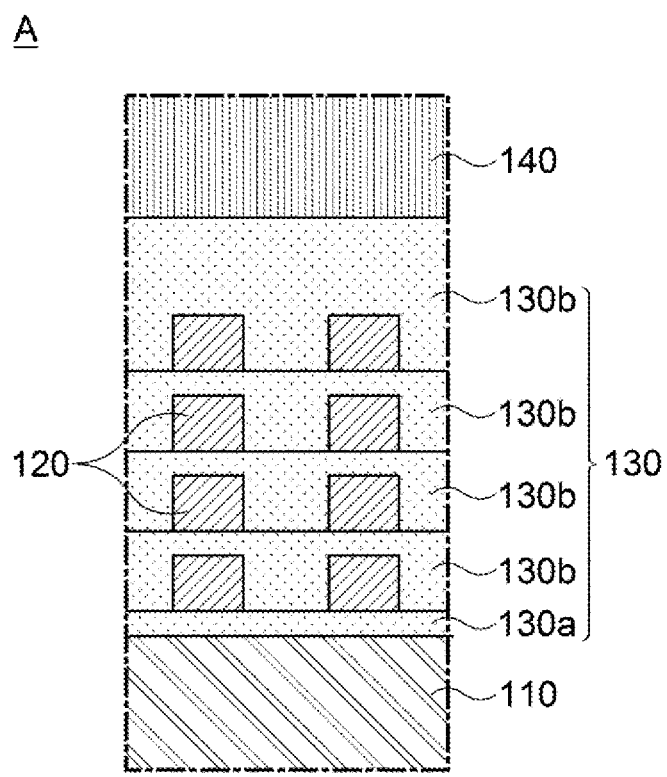
FIG. 3 is an enlarged view of part A of FIG. 2.

FIG. 3 is an enlarged view of part A of FIG. 2.

Referring to FIG. 3, the insulating layer 130 may include a first insulating layer 130a and a plurality of second insulating layers 130b sequentially stacked from a lower portion of the insulating layer 130 by spin coating or the like.

The first insulating layer 130a, which is the lowest layer of the insulating layer 130 and is in contact with the first magnetic member 110, may be a base layer for the coil conductors 120 formed in the lowest layer, and may electrically insulate the coil conductors 120 formed in the lowest layer from the first magnetic member 110. In addition, the first insulating layer 130a may suppress unevenness of the surface of the first magnetic member 110 to provide flatness to a surface on which the coil conductors 120 are to be formed.

The second insulating layers 130b may cover the coil conductors 120 to physically protect the coil conductors 120. The second insulating layers 130b may be repeatedly stacked according to the number of coil conductors 120, and the uppermost second insulating layer 130b may electrically insulate the coil conductors 120 formed in the uppermost layer from the second magnetic member 140.

According to the above-mentioned structure of the insulating layer 130, a thickness of the second insulating layer 130b disposed between the second magnetic member 140 and the coil conductors 120 formed in the uppermost layer may be approximately similar to the interval L1 between the coil conductors 120 which are closest to the second magnetic member 140, that is, the coil conductors 120 in the uppermost layer and the second magnetic member 140. Thus, when the second insulating layer 130b is formed, the second insulating layer 130b may be formed by varying the thickness thereof depending on an impedance value necessary to match characteristic impedance (Zo).

Specifically, the thickness of the second insulating layer 130b may exceed 10 μm. In a case in which the thickness of the second insulating layer 130b is 10 μm or less, it may be difficult to secure flatness for a bonded surface of the second magnetic member 140 due to the uneven portions resulting from the thickness of the coil conductors 120.

In addition, the first insulating layer 130a may have the thickness of 6 μm or less. As described above, since the variations in impedance are insensitive to the interval L2 between the first magnetic member 110 and the coil conductors 120 which are closest to the first magnetic member 110, the thickness of the first insulating layer 130a may be sufficient as long as it may secure flatness for the surface on which the coil conductors 120 are formed, and there is no need to form the first insulating layer 130a to be thicker than necessary.

Figure 4:
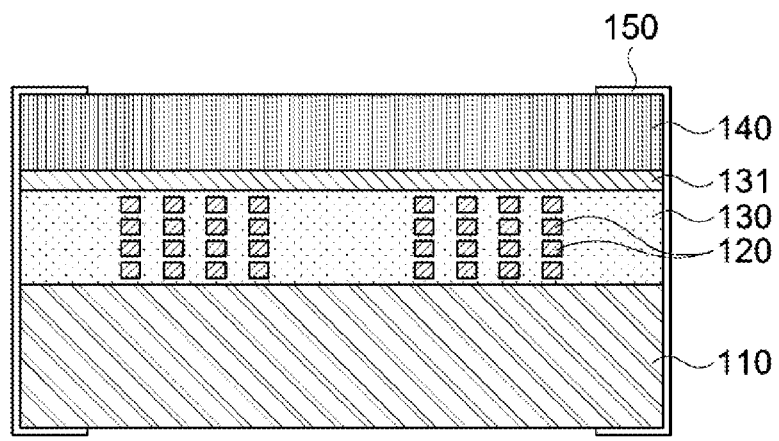
FIG. 4 is a cross-sectional view of a coil component according to another embodiment in the present disclosure.

FIG. 4 is a cross-sectional view of a coil component 101 according to another exemplary embodiment.

According to the present exemplary embodiment, the insulating layer 130 and the second magnetic member 140 may be sequentially stacked on the first magnetic member 110, which is the supporting layer. The first magnetic member 110 and the second magnetic member 140 may have the same configuration as that of the exemplary embodiment described above. That is, the first magnetic member 110 may be the magnetic substrate formed of the sintered ferrite, and the second magnetic member 140, which is the magnetic resin composite in which the magnetic powders are dispersed in the polymer resin, may have permeability lower than that of the first magnetic member 110.

An impedance adjusting member 131 formed of the same kind of polymer resin as the insulating layer 130, for example, the epoxy resin, the phenol resin, the urethane resin, the silicon resin, the polyimide resin, or the like, may be disposed between the second magnetic member 140 and the insulating layer 130.

That is, according to the present exemplary embodiment, the impedance is not adjusted by adjusting the interval L1 between the second magnetic member 140 and the coil conductors 120, for example, the thickness of the second insulating layer 130b; instead, the impedance may be adjusted by separately forming the impedance adjusting member 131 and varying a thickness of the impedance adjusting member 131.

As such, in a case in which the impedance adjusting member 131 is used, the coil component may be manufactured by forming the impedance adjusting member 131 having various thicknesses in advance, selecting the impedance adjusting member 131 having a suitable thickness necessary to match impedance, and then attaching the selected impedance adjusting member 131 to the second insulating layer, whereby a process yield may be improved.

Although the case in which the coil conductors 120 are formed in the plurality of layers is described by way of example, characteristic impedance (Zo) may be matched by varying the interval L1 between the coil conductors 120 and the second magnetic member 140 or inserting the impedance adjusting member 131 between the insulating layer 130 and the second magnetic member 140 even in a case in which the coil conductors 120 are formed in a single layer.

According to another exemplary embodiment, the first magnetic member 110 may be formed by using the magnetic resin composite in which the magnetic powders are dispersed in the polymer resin.

According to the exemplary embodiment described above, although the magnetic substrate formed of the sintered ferrite is used as the first magnetic member 110, defects such as cracking of the magnetic substrate may occur during a process of handling the magnetic substrate because the magnetic substrate is a ceramic sintered body.

In order to solve the above-mentioned problem, according to the present exemplary embodiment, the first magnetic member 110 may be formed of the magnetic resin composite in which the magnetic powders are dispersed in the polymer resin, instead of the magnetic substrate. As a result, defects such as cracking may be decreased due to flexibility of the resin contained in the first magnetic member 110.

Figure 5:
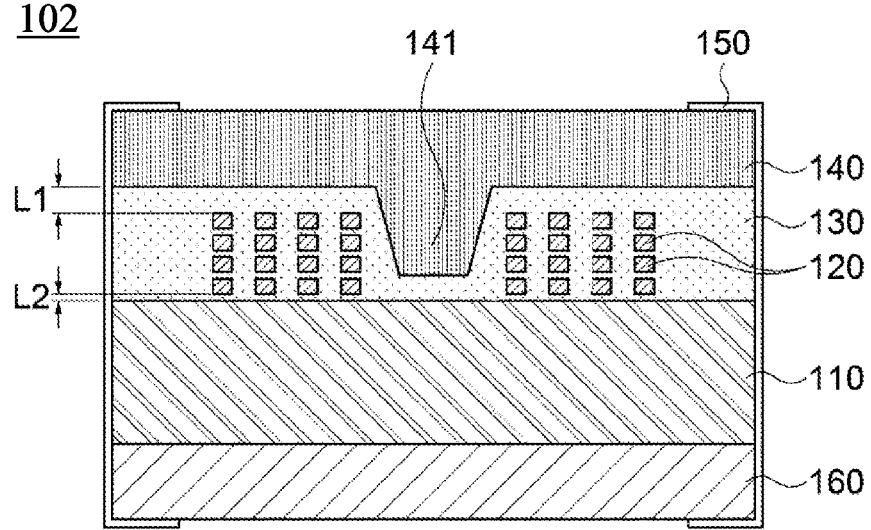
FIG. 5 is a cross-sectional view of a coil component according to another embodiment in the present disclosure.

FIG. 5 is a cross-sectional view of a coil component 102 according to another exemplary embodiment.

The positions and functions of the first magnetic member 110, the second magnetic member 140, and the insulating layer 130 in which the coil conductors 120 included in the present exemplary embodiment are embedded may be similar to those of the exemplary embodiment described above, and the constituent in which the interval L1 between the second magnetic member 140 and the coil conductors 120 varies depending on the required impedance value may also be similar to that of the exemplary embodiment described above.

However, according to the present exemplary embodiment, an electrostatic discharge (ESD) protection layer 160 may be further formed below the first magnetic member. Here, the ESD protection layer 160 may form a thermistor structure to allow the coil component, according to the present exemplary embodiment, to serve as an ESD protection element.

More specifically, the ESD protection layer 160 may be formed so that two ESD electrodes are spaced apart from each other, and may be formed by filling an ESD material in a space between the spaced ESD electrodes, wherein as the ESD material, a material in which a conductive metal such as copper (Cu), silver (Ag), or the like is dispersed in an insulating inorganic material or an insulating organic material such as aluminum oxide ($Al_2O_3$), titanium oxide ($TiO_2$), zinc oxide (ZnO), or the like may be used. In addition, the coil component, according to the present exemplary embodiment, may further include external electrodes which are electrically connected to the ESD electrodes in the ESD protection layer 160.

By the above-mentioned structure, according to the exemplary embodiment, an overcurrent introduced into the coil component due to a surge voltage may discharged to the ESD electrodes via the ESD material forming conductive paths between conductive particles according to an electron tunneling phenomenon, and as a result, the circuit may be protected from the overcurrent.

As set forth above, according to exemplary embodiments, the impedance value of the coil component necessary to match characteristic impedance (Zo) may be easily adjusted without significantly increasing a total thickness of the coil component by varying the thickness of the insulating layer which is adjacent to a magnetic member having low permeability.

While exemplary embodiments have been shown and described above, it will be apparent to those skilled in the art that modifications and variations could be made without departing from the scope of the present invention as defined by the appended claims.

What is claimed is:

1. A coil component comprising:
   a first magnetic member;
   an insulating layer in which coil conductors are embedded, and in contact with an upper surface of the first magnetic member; and
   a second magnetic member in contact with an upper surface of the insulating layer, and having permeability lower than that of the first magnetic member,
   wherein the insulating layer comprises a first insulating layer in contact with the upper surface of the first magnetic member, and a second insulating layer disposed on the first insulating layer to cover the coil conductors,
   wherein the second insulating layer includes at least two lower insulating layers, and an upper insulating layer which contacts a bottom surface of the second magnetic member,
   wherein the upper insulating layer is thicker than at least one of the at least two lower insulating layers, and
   wherein the first insulating layer is thinner than the second insulating layer.

2. The coil component of claim 1, wherein the first insulating layer has a thickness of 6 μm or less, and
   the thickness of the second insulating layer exceeds 10 μm.

3. The coil component of claim 1, wherein the coil conductors are provided in a plurality of layers stacked on one another, and an interval L1 between the coil conductors in a layer which is closest to the second magnetic member among the coil conductors in the plurality of layers and the second magnetic member depends on an intended impedance value.

4. The coil component of claim 1, wherein the first magnetic member is a magnetic substrate formed of a sintered ferrite material.

5. The coil component of claim 1, wherein the first magnetic member is a magnetic resin composite in which a magnetic powder is dispersed in a polymer resin.

6. The coil component of claim 1, wherein the second magnetic member is a magnetic resin composite in which a magnetic powder is dispersed in a polymer resin.

7. The coil component of claim 1, further comprising a magnetic core protruding from a surface of the second magnetic member into the insulating layer.

8. The coil component of claim 1, further comprising an electrostatic discharge (ESD) protection layer disposed below the first magnetic member.

9. The coil component of claim 1, wherein an interval L1 which is the shortest distance between the coil conductors and the second magnetic member is greater than an interval L2 which is the shortest distance between the coil conductors and the first magnetic member.

10. A coil component comprising:
a first magnetic member;
a second magnetic member having permeability lower than that of the first magnetic member;
an insulating layer comprising a first insulating layer in contact with an upper surface of the first magnetic member, and a second insulating layer disposed on the first insulating layer, and
coil conductors disposed between the first and second magnetic members and spaced-apart from the first and second magnetic members,
wherein the second insulating layer includes at least two lower insulating layers, and an upper insulating layer which contacts a bottom surface of the second magnetic member,
wherein the upper insulating layer is thicker than at least one of the at least two lower insulating layers,
wherein the shortest interval between the coil conductors and the second magnetic member is greater than the shortest interval between the coil conductors and the first magnetic member, and
wherein the shortest interval between the coil conductors and the first magnetic member depends on an intended impedance value.

11. The coil component of claim 10, further comprising a magnetic core protruding from a surface of the second magnetic member and surrounded by the coil conductors.

* * * * *